(12) United States Patent
Nandi et al.

(10) Patent No.: US 12,598,777 B2
(45) Date of Patent: Apr. 7, 2026

(54) LOW TEMPERATURE, HIGH GERMANIUM, HIGH BORON SIGE:B PEPI WITH TITANIUM SILICIDE CONTACTS FOR ULTRA-LOW PMOS CONTACT RESISTIVITY AND THERMAL STABILITY

(71) Applicant: Intel Corporation, Santa Clara, CA (US)

(72) Inventors: Debaleena Nandi, Hillsboro, OR (US); Cory Bomberger, College Park, MD (US); Diane Lancaster, Hillsboro, OR (US); Gilbert Dewey, Beaverton, OR (US); Sandeep K. Patil, Portland, OR (US); Mauro J. Kobrinsky, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 841 days.

(21) Appl. No.: 17/558,231

(22) Filed: Dec. 21, 2021

(65) Prior Publication Data

US 2023/0197817 A1 Jun. 22, 2023

(51) Int. Cl.
*H01L 29/423* (2006.01)
*H01L 29/06* (2006.01)
(Continued)

(52) U.S. Cl.
CPC ..... *H10D 30/6735* (2025.01); *H10D 30/6737* (2025.01); *H10D 30/6743* (2025.01);
(Continued)

(58) Field of Classification Search
CPC ........... H10D 30/6735; H10D 30/6737; H10D 30/6743; H10D 30/6757; H10D 62/121;
(Continued)

(56) References Cited

U.S. PATENT DOCUMENTS 11,094,782 B1 8/2021 Trivedi
2015/0048417 A1 2/2015 Kwok
(Continued)

FOREIGN PATENT DOCUMENTS

EP 3624200 A 3/2020
TW 201926695 7/2019

OTHER PUBLICATIONS

Search Report from European Patent Application No. 22208658.9, mailed May 17, 2023, 10 pgs.
(Continued)

*Primary Examiner* — Tong-Ho Kim
(74) *Attorney, Agent, or Firm* — Schwabe, Williamson & Wyatt P.C.

(57) ABSTRACT

Gate-all-around integrated circuit structures having confined epitaxial source or drain structures, are described. For example, an integrated circuit structure includes a plurality of nanowires above a sub-fin. A gate stack is over the plurality of nanowires and the sub-fin. Epitaxial source or drain structures are on opposite ends of the plurality of nanowires. The epitaxial source or drain structures comprise i) a first PMOS epitaxial (pEPI) region of germanium and boron, ii) a second pEPI region of silicon, germanium and boron on the first pEPI region at a contact location, iii) titanium silicide conductive contact material on the second pEPI region.

14 Claims, 10 Drawing Sheets

350

(51) Int. Cl.

| | |
|---|---|
| *H01L 29/161* | (2006.01) |
| *H01L 29/45* | (2006.01) |
| *H01L 29/786* | (2006.01) |
| *H10D 30/67* | (2025.01) |
| *H10D 62/10* | (2025.01) |
| *H10D 62/832* | (2025.01) |

(52) U.S. Cl.
CPC ....... *H10D 30/6757* (2025.01); *H10D 62/121* (2025.01); *H10D 62/832* (2025.01)

(58) Field of Classification Search
CPC .. H10D 62/832; H10D 84/144; H10D 84/201; A61K 40/4218; H02K 15/027; H02K 15/38; B82Y 10/00; H10F 30/2863; H10F 30/2857; H10F 99/00
USPC .......................................................... 257/401
See application file for complete search history.

(56) References Cited

U.S. PATENT DOCUMENTS

| | | | |
|---|---|---|---|
| 2018/0151733 A1 | 5/2018 | Glass | |
| 2019/0319098 A1 | 10/2019 | Tai | |
| 2019/0348415 A1 | 11/2019 | Sung et al. | |
| 2020/0006545 A1 | 1/2020 | Liu | |
| 2020/0013900 A1* | 1/2020 | Carr | H01L 21/76865 |
| 2020/0020774 A1 | 1/2020 | Lee | |
| 2020/0091011 A1 | 3/2020 | Khaderbad | |
| 2020/0105932 A1 | 4/2020 | Li et al. | |
| 2020/0365585 A1* | 11/2020 | Jambunathan | H10D 84/038 |
| 2021/0066477 A1 | 3/2021 | Lee | |
| 2021/0193829 A1 | 6/2021 | Reznicek | |
| 2021/0202740 A1* | 7/2021 | Li | H10D 84/038 |
| 2021/0257452 A1 | 8/2021 | Trivedi | |
| 2022/0052203 A1* | 2/2022 | More | H01L 21/26513 |
| 2022/0190109 A1 | 6/2022 | Choi | |
| 2022/0254928 A1 | 8/2022 | Shin | |
| 2022/0328627 A1 | 10/2022 | Chang | |
| 2024/0372007 A1 | 11/2024 | More | |
| 2024/0387735 A1 | 11/2024 | More | |

OTHER PUBLICATIONS

Yu Hao et al: "Low-Resistance Titanium Contacts and Thermally Unstable Nickel Germanide Contacts on p-Type Germanium", IEEE Electron Device Letters, IEEE, USA, vol. 37, No. 4, Apr. 1, 2016 (Apr. 1, 2016), pp. 482-485, XP011604053, ISSN: 0741-3106, DOI: 10.1109/LED.2016.2524041 [retrieved on Mar. 22, 2016].

Search Report from European Patent Application No. 22185002.7, mailed Dec. 20, 2022, 11 pgs.

Search Report from European Patent Application No. 22191316.3, mailed Feb. 10, 2023, 13 pgs.

Office Action from U.S. Appl. No. 17/485,167, mailed Jun. 13, 2024, 19 pgs.

Office Action from European Patent Application No. 22208658.9, mailed Apr. 14, 2025, 6 pgs.

Office Action from U.S. Appl. No. 17/482,880 mailed Jun. 13, 2025, 21 pgs.

Office Action from U.S. Appl. No. 17/485,167, mailed Dec. 16, 2024, 23 pgs.

Office Action from Taiwan Patent Application No. 111130755, mailed Nov. 18, 2025, 23 pgs.

Notice of Allowance from Taiwan Patent Application No. 111130755, mailed Jan. 30, 2026, 3 pgs.

* cited by examiner

FIN CUT:
300

GATE CUT:
300

352

366

365

359

LOW TEMPERATURE, HIGH GERMANIUM, HIGH BORON SIGE:B PEPI WITH TITANIUM SILICIDE CONTACTS FOR ULTRA-LOW PMOS CONTACT RESISTIVITY AND THERMAL STABILITY

TECHNICAL FIELD

Embodiments of the disclosure are in the field of integrated circuits and, in particular, the methods and systems for a low temperature, high germanium, high boron SiGe:B pEPI with titanium silicide contacts for ultra-low PMOS contact resistivity and thermal stability.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive forever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

DESCRIPTION OF THE EMBODIMENTS

Figure 1B:
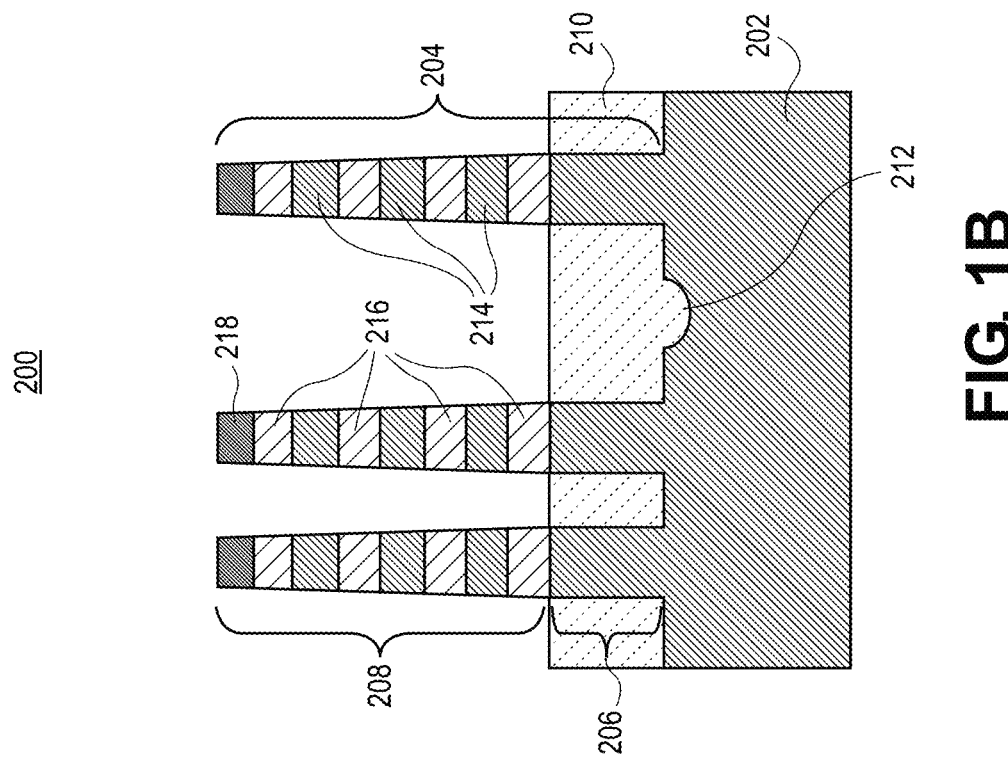
FIG. 1B illustrates a cross-sectional view of a nanowire or nanoribbon precursor structure.

Transistors having a low temperature, high germanium, high boron SiGe:B pEPI with titanium silicide contacts for ultra low PMOS contact resistivity and thermal stability are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating transistors with a low temperature, high germanium, high boron SiGe:B pEPI with titanium silicide contacts for ultra-low PMOS contact resistivity and thermal stability. The embodiments may be applicable to GAA and finFET transistors and to backside contact formation.

Figure 1A:
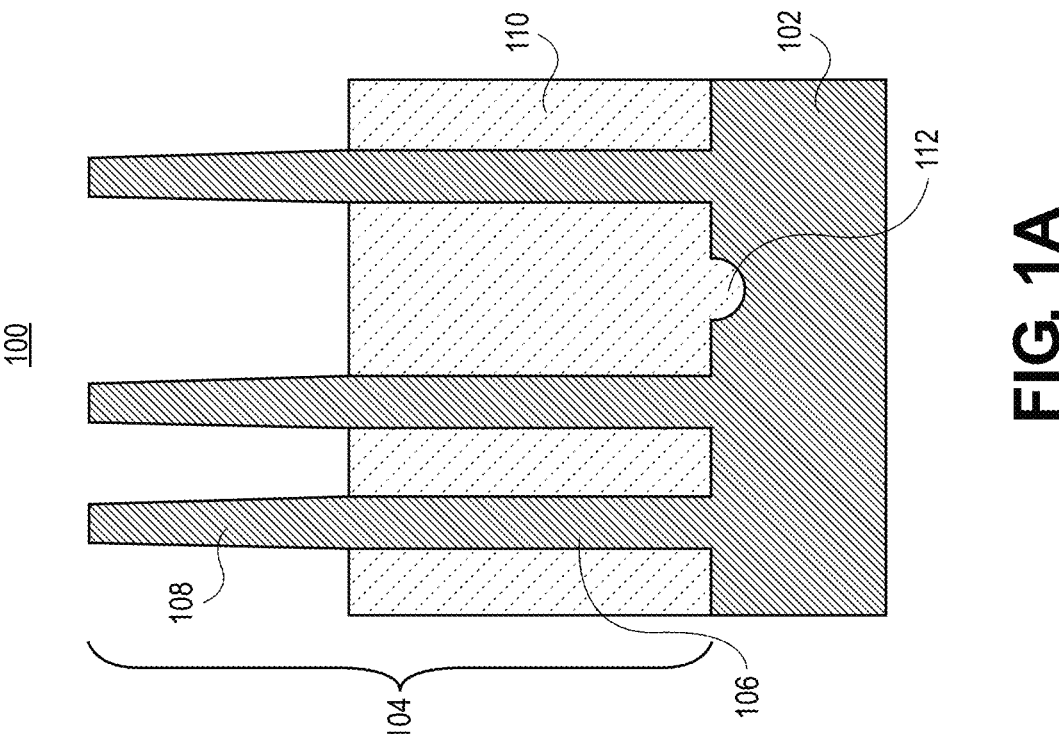
FIG. 1A illustrates a cross-sectional view of a finFET structure having high aspect ratio isolation structures and subfins.

For comparative purposes, FIG. 1A illustrates a cross-sectional view of a finFET structure 100 having high aspect ratio isolation structures and sub-fins. Referring to FIG. 1A, finFET structure 100 includes a plurality of fins 104 above and/or protruding from a substrate 102, such as a silicon substrate. Each fin 104 includes a sub-fin portion 106 and a protruding or active fin portion 108. An isolation structure 110 is between and adjacent to sub-fin portions 106 of the plurality of fins 104. It is to be appreciated that the plurality of fins 104 can include locations where individual fins have been removed, for example at location 112.

By contrast to FIG. 1A, FIG. 1B illustrates a cross-sectional view of a nanowire or nanoribbon precursor structure 200. Referring to FIG. 1B, nanowire or nanoribbon precursor structure 200 includes a plurality of fins 204 above and/or protruding from a substrate 202, such as a silicon substrate. Each fin 204 includes a sub-fin portion 206 and a protruding fin portion 208. An isolation structure 210 is between and adjacent to sub-fin portions 206 of the plurality of fins 204. It is to be appreciated that the plurality of fins 204 can include locations where individual fins have been removed, for example at location 212. Each of the protruding fin portions 208 includes a plurality of nanowires or nanoribbons 214 (e.g., silicon nanowires or nanoribbons). Unless stated specifically to the alternative, the terms nanowires and nanoribbons can be used interchangeably throughout this disclosure. Each of the protruding fin portions 208 also includes a sacrificial release layers 216, such as silicon germanium sacrificial release layers. In other embodiments, the nanowires/nanoribbons could comprise a material such as silicon and germanium (SiGe), Ge, or group III-V compounds. In this case, the sacrificial release layers could be Si. In an embodiment, each of the protruding fin portions 208 also includes a capping dielectric layer 218, which can be included for fin protection, and may ultimately be retained or removed. The structure of FIG. 1B can be subjected to further processing, such as nanowire release (sacrificial layer removal), gate formation, spacer formation, and epitaxial source or drain formation.

Figure 2B:
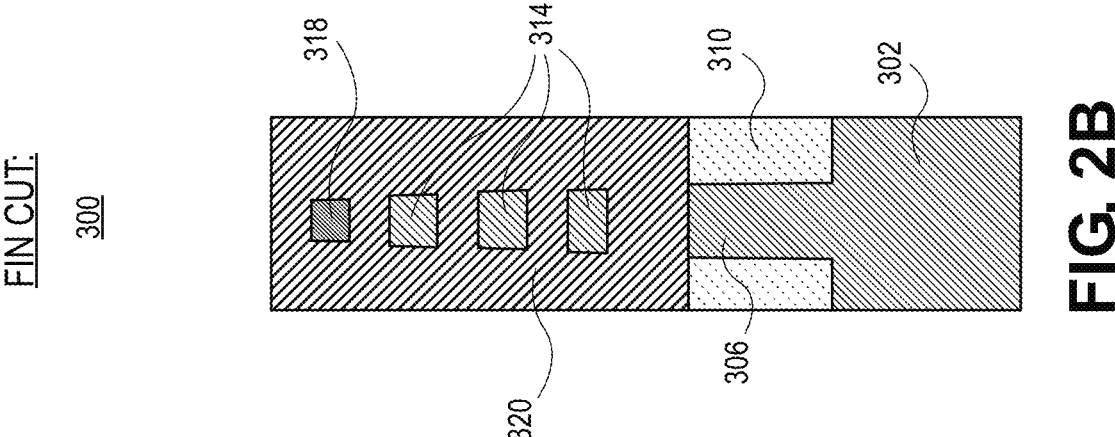
FIGS. 2A and 2B illustrate a gate cut cross-sectional view and a fin cut cross-sectional view, respectively, of a gate-all-around integrated circuit structure.
Figure 2A:
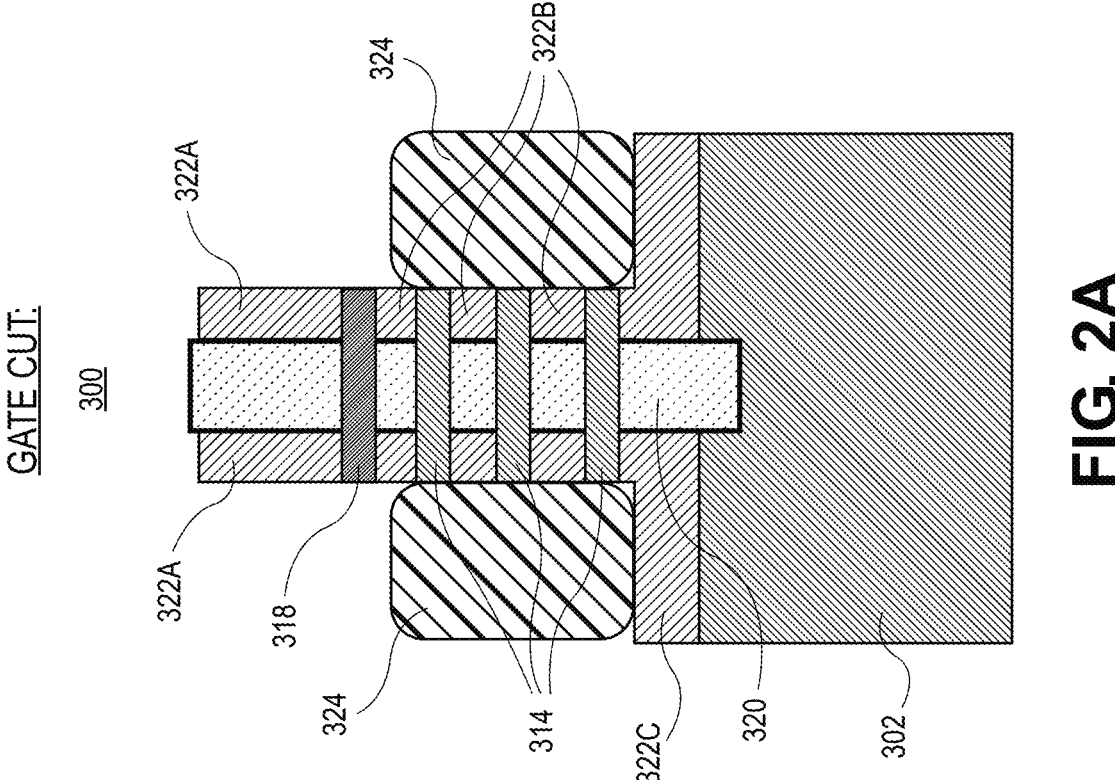

As an example, FIGS. 2A and 2B illustrate a gate cut cross-sectional view and a fin cut cross-sectional view, respectively, of a gate-all-around integrated circuit structure 300. Gate-all-around integrated circuit structure 300 includes a plurality of nanowires 314 above a substrate 302. The nanowires 314 are above a sub-fin 306 above or protruding from the substrate 302. An isolation structure 310 is either side of the sub-fin 306. In one embodiment, as is depicted, a dielectric capping layer 318 is above the plurality of nanowires 314. A gate stack 320 (such as a gate electrode and gate dielectric stack) is over the plurality of nanowires 314, around individual nanowires 314, and over the sub-fin 306.

Referring again to FIGS. 2A and 2B, epitaxial source or drain structures 324 are included at first and second ends of the plurality of nanowires 314. External gate spacers 322A and internal gate spacers 322B are included between the gate stack 320 and the epitaxial source or drain structures 324. Spacer extensions 322C can be included between the epitaxial source or drain structures 324 and the substrate 302. If spacer extensions 322C are not included, well doping may be required (similar to fin technology) to control substrate leakage.

The spacer extensions 322C can be continuous with or discrete from the internal gate spacers 322B. Also, the internal gate spacers 322B can be continuous with or discrete from the external gate spacers 322A.

The epitaxial (epi) source or drain structures 324 may comprise PMOS source/drains comprising germanium (Ge) and silicon (Si) doped with boron (B), SiGe:B, where the percentage of germanium is high compared to the percentage of silicon. High Ge containing SiGe:B PMOS source/drains (up to 100%) are needed for low contact resistivity. However, in-situ doping of higher germanium percentage films is traditionally challenging, as germanium and boron typically compete for incorporation. Additionally, high germanium percentage films are easily etched in downstream processing and have a low chance of serving to end of line when deposited at a traditional mid-section.

Previous solutions to prevent etch out the epi were to minimize the amount of etchants the epi is exposed to with ex-situ masks and keeping the germanium concentration low enough to minimize the epi loss from the etchants. To get maximum germanium and boron, traditionally there is a balance struck between in-situ doping with boron and the germanium percentage for optimum resistivity, as well as the addition of boron implants post deposition (or just before contact formation).

Additional problems are encountered when considering the composition of metal contacts made to the SiGe:B PMOS source/drain structures 324. Typically, the contacts comprise nickel and platinum, which is now being replaced with titanium (Ti). However, titanium contacts on crystalline SiGe have large work function mismatch and the titanium contacts that are created during fabrication are thermally unstable to post Ti deposition anneals. Further, Ti contacts on SiGe PMOS have a high contact resistivity (rho_c) greater than 4-5 e$^{-9}$ Ohm cm$^2$.

Capping layers applied to SiGe:B PMOS source/drain structures 324 have been proposed. For example, a high Ge percentage (>60-100%) capping layer has been proposed to address the Ti—SiGe workfunction mismatch, which may reduce the contact resistivity to 2.3 e$^{-9}$ Ohm cm$^2$. However, due to high solubility of Ti in Ge, high temperature processing steps post Ti deposition lead to Ti—Ge intermixing and voids. This results in PMOS contact resistivity degradation in spite of reduced work-function mismatch. The high Ge percentage capping layer is also etched by solvents. A silicon rich capping layer applied before Ti contact deposition has also been proposed. However, the silicon rich capping layer adds significantly to manufacturing costs when fabricating billions of transistors.

In accordance with one or more embodiments described herein, structures and architectures for transistors (e.g., GAA and FinFETs) having an ultra-low PMOS contact resistivity of less than 1 $e^{-9}$ Ohm cm$^2$ with titanium silicide contacts are disclosed. The low PMOS contact resistivity is a result of growing a low temperature, high Ge, high B SiGe:B PMOS epitaxial material over the PMOS epitaxial (pEPI) source/drain structures, and forming titanium silicide contacts on the high Ge, high B SiGe:B PMOS epitaxial material. The disclosed embodiments result in a PMOS contact resistivity with titanium silicide of less than 1 $e^{-9}$ Ohm cm$^2$ and thermal stability that minimizes Ti—SiGe interdiffusion up to 450° C. for 2 hrs. and 500° C. for 5 min.

Figure 3A:
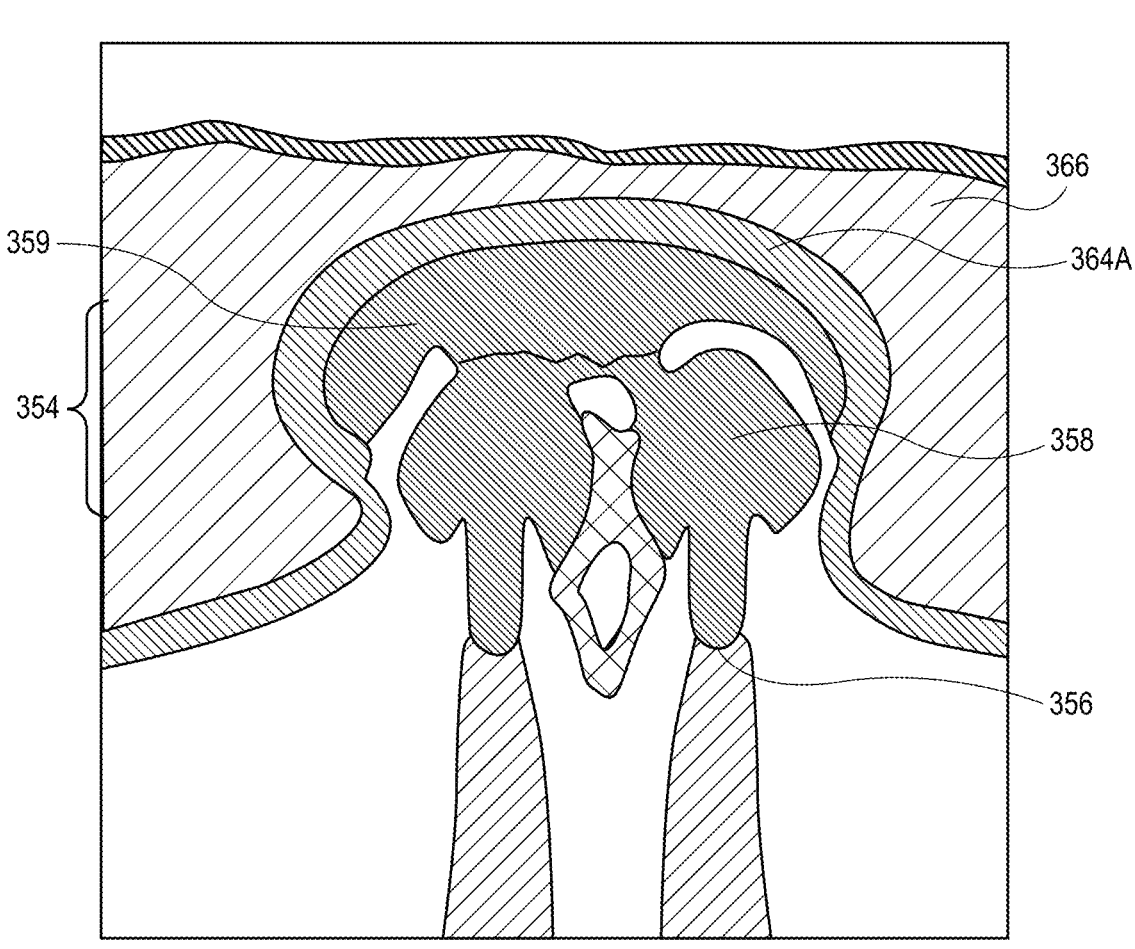
FIG. 3A illustrates a cross-fin transmission electron microscopy (TEM) image of gate-all-around integrated circuit structures having epitaxial source or drain structures protected by ultra-low PMOS contact resistivity structures of the disclosed embodiments

FIG. 3A illustrates a cross-fin transmission electron microscopy (TEM) image of gate-all-around integrated circuit structures 350 having epitaxial source or drain structures 354 protected by ultra-low PMOS contact resistivity structures of the disclosed embodiments. The gate-all-around integrated circuit structure 350 includes epitaxial source or drain structures 354 at first and second ends of a plurality of nanowires (not shown) above a sub-fin 356 of a substrate (not shown) within a PMOS region. A gate stack, also not show, is over the plurality of nanowires, around individual nanowires, and over the sub-fin 356, as described in FIGS. 2A and 2B. A conductive contact material 364A comprising titanium silicide is formed over and on the epitaxial source or drain structures 354.

According to embodiments of the present disclosure, the epitaxial source or drain structures 354 comprise a first pEPI region 358 of germanium and boron (Ge:B) above the sub-fin 356. In this view, portions of the epitaxial source or drain structures 354 appear diamond-shaped. The first pEPI region 358 is protected by ultra-low PMOS contact resistivity structures comprising i) a second pEPI region 359 of silicon, germanium and boron on the first pEPI region 358 at a contact location, and ii) a conductive contact material 364A comprising titanium silicide is over the second pEPI region 359. In embodiments, the contact location can be defined as a location where the conductive contact material 364A is formed on the second pEPI region 359. Another conductive contact material 366 (e.g., cobalt or tungsten) is over conductive contact material 364A. In embodiments, the conductive contact material 364A may comprise a same or a different conductive material as conductive contact material 366. The ultra-low PMOS contact resistivity structures protect the first pEPI region 358 from etch out and downstream temperature deltas.

Figure 3B:
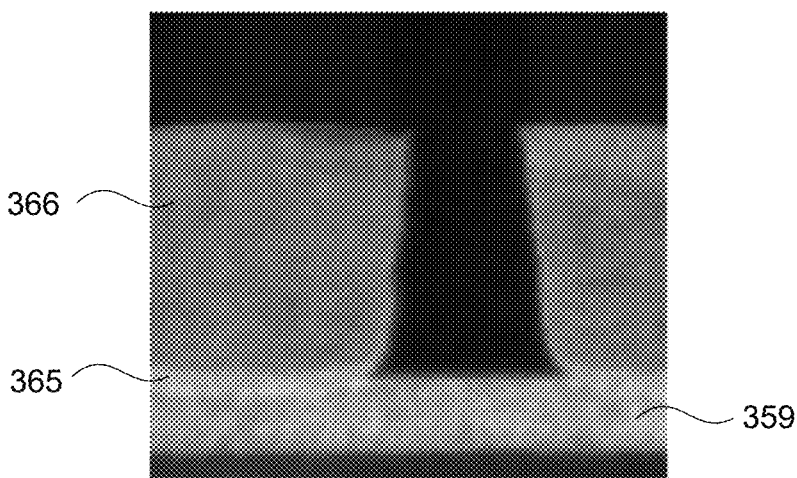
FIG. 3B illustrates another TEM view of a gate-all-around integrated circuit structure.

FIG. 3B illustrates another TEM view of a gate-all-around integrated circuit structure 352 showing the second pEPI region 359 comprising a low temperature, high Ge, high B SiGe:B PMOS epitaxial material over the first pEPI region 358 (not shown), titanium silicide 365 on the second pEPI region 359 forming a contact location, and a conductive contact material 366 over the titanium silicide 365. The disclosed embodiments directly deposits titanium silicide 365, rather than titanium and, to interface with the second pEPI region 359 without use of a capping layer. The TEM view shows structure 352 after a 450° C., 2 hr. anneal, and as shown, no thermal degradation is observed at the titanium silicide 365 interface with the second pEPI region 359 even with a 500° C., 5 min. anneal. Deposition of the titanium silicide 365 on the low temperature, high Ge, high B SiGe:B PMOS epitaxial material helps to reduce the Schottky barrier to tunneling at the SiGe to titanium silicide 365 interface resulting in ultra-low PMOS rho_c of ~1 $e^{-9}$ Ohm cm$^2$-1.5 $e^{-9}$ Ohm cm$^2$.

In contrast, a gate-all-around integrated circuit structure having a pristine low temperature, high Ge, high B SiGe:B PEPI with titanium contacts and a conductive contact material over the titanium contacts after a 450° C., 2 hr. anneal would lead to intermixing of the titanium and the GE, which may also lead to voids in the low temperature, high Ge, high B SiGe:B PEPI.

Referring to FIG. 3A, the fabrication process may begin by growing the first pEPI region 358. The first pEPI region 358 may be considered pure pEPI. In one embodiment, the first pEPI region 358 may comprise a lower atomic percentage of germanium of approximately 50-55% and a lower atomic percentage of boron compared to the second pEPI region 359. In another embodiment, the atomic percentage of germanium in first pEPI region 358 may be up to 100%. The first pEPI region 358 may further include Si (SiGe:B).

Once the first pEPI region 358 is grown, at contact formation the first pEPI region 358 is opened at the contact location, and the second pEPI region 359 is then regrown around the first pEPI region 358 at the contact location. The second pEPI region 359 may comprise an atomic percentage of germanium of approximately 60-100% at the interface, a high chemical concentration of boron of approximately 1 $e^{21}$/cm$^3$ and optionally Si. The second pEPI region 359 is grown to maximize the area of, and to protect, the first pEPI region 358 from reaction with the titanium silicide conductive contact material 364A. The second pEPI region 359 may be grown at a relatively low temperature of less than 550° C. measured by transfer length measurement. The second pEPI region 359 may thus be considered a low temperature, high Ge, high B SiGe:B pEPI. In one embodiment, the second pEPI region 359 may be approximately 6-10 nm in thickness.

The titanium silicide conductive contact material 364A is then formed over the second pEPI region 359. In one example embodiment, the titanium silicide conductive contact material 364A may be formed by one or more cycles of: i) depositing TiCl4 to a thickness of approximately 4-6 nm; ii) deposition of H2 plasma to remove unreactive Ti; and iii) application of a silane soak for Si enrichment to form titanium silicide.

After formation of the Ti silicide conductive contact material 364A, another same or different conductive contact material 366, such as cobalt or tungsten for example, is deposited over the Ti silicide conductive contact material 364A to form a metal 0 layer (M0). Thereafter, metal 1 through metal M and corresponding vias are formed. According to the disclosed embodiments after downstream processing, the Ti silicide conductive contact material 364A diffuses into the second pEPI region 359 less than approximately 2 nm with little to no void formation. Another advantage is that the Ti silicide conductive contact material 364A and the second pEPI region 359 protects the first pEPI region 358 from being etched during N/P patterning in midsection, as Ge:B is very easily etched away. The presence of a high Ge % (up to 100%) first pEPI region 358 will result in a low Schottky barrier and low contact resistivity. Use of ultra-low PMOS contact resistivity structures (second pEPI region 359 of high Ge, high B SiGe:B PMOS epitaxial (pEPI) material with Ti-silicide contacts thereon results in in ultra-low PMOS contact resistivity (rho_c) of less than 1e−9 Ohm cm$^2$ with thermal stability. An ultra low rho_c value ~1 e−9 Ohm cm$^2$ is indicative of the low temperature of less that ~550C. growth of the high Ge, high B SiGe:B PEPI.

This method is compatible with high volume manufacturing for GAA, finFets and backside contact formation, and provides performance benefits.

In the embodiment shown, the epitaxial source or drain structures 354 are non-discrete epitaxial source or drain structures. However, in another such embodiment, the epitaxial source or drain structures 354 are discrete epitaxial source or drain structures, structural examples of which are described further below.

It is to be appreciated, in a particular embodiment, channel layers the GAA transistor may be silicon, and intervening layers may be silicon germanium. As used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer may include a silicon layer that contains a relatively small amount, e.g., "impurity" level, non-Si atoms or species, such as Ge, C or Sn.

Described below are various processing schemes and devices that may involve a gate-all-around integrated circuit structure having titanium silicide contacts for thermal stability and low PMOS contact resistivity. It is to be appreciated that the exemplary embodiments need not necessarily require all features described, or may include more features than are described.

Nanowire release processing may be performed through a replacement gate trench. Additional examples of such release processes are described below. Embodiments described herein may be implemented to enable front-side and back-side interconnect integration for nanowire transistors. The result may be improved product performance and lower patterning costs. Embodiments may be implemented to enable robust functionality of scaled nanowire or nanoribbon transistors with low power and high performance.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors, which are partially filled with SD epitaxy. A remainder of the opening is filled with a conductive material. Deep trench formation on one of the source or drain side enables direct contact to a back-side interconnect level.

As an exemplary process flow, FIGS. 4A-4J illustrates cross-sectional views of various operations in a method of fabricating a gate-all-around integrated circuit structure, in accordance with an embodiment of the present disclosure.

Figure 4B:
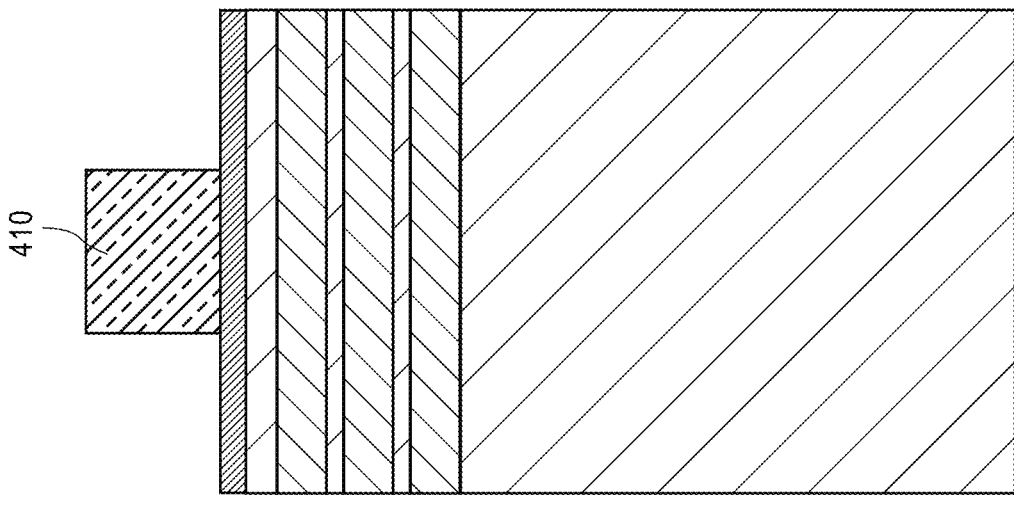
FIGS. 4A-4J illustrates cross-sectional views of various operations in a method of fabricating a gate-all-around integrated circuit structure, in accordance with an embodiment of the present disclosure.
Figure 4A:
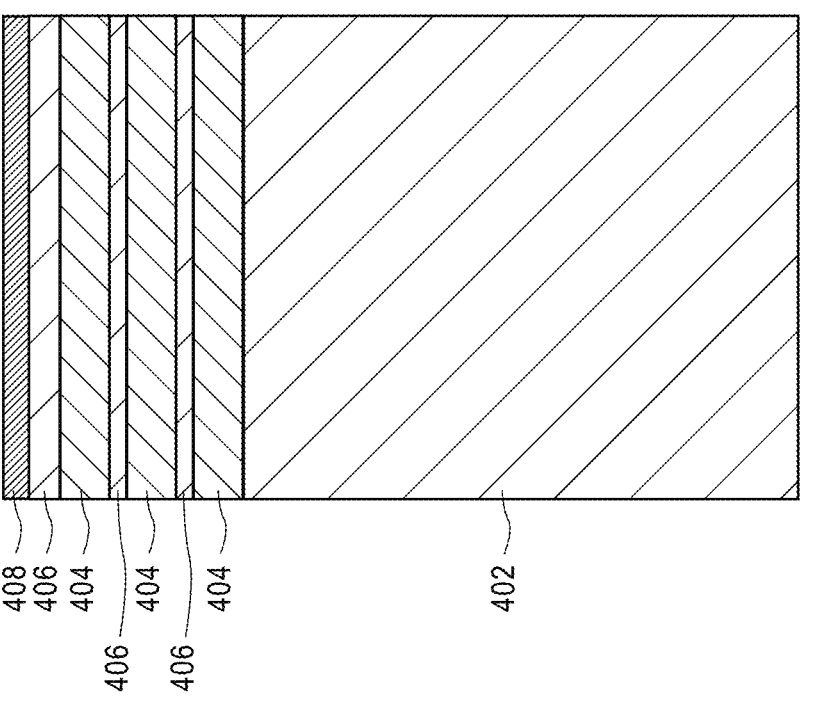

Referring to FIG. 4A, a method of fabricating an integrated circuit structure includes forming a starting stack 400 which includes alternating silicon germanium layer 404 and silicon layers 406 above a fin 402, such as a silicon fin. The silicon layers 406 may be referred to as a vertical arrangement of silicon nanowires. A capping cap 408 may be formed above the alternating silicon germanium layer 404 and silicon layers 406, as is depicted.

Figure 4C:
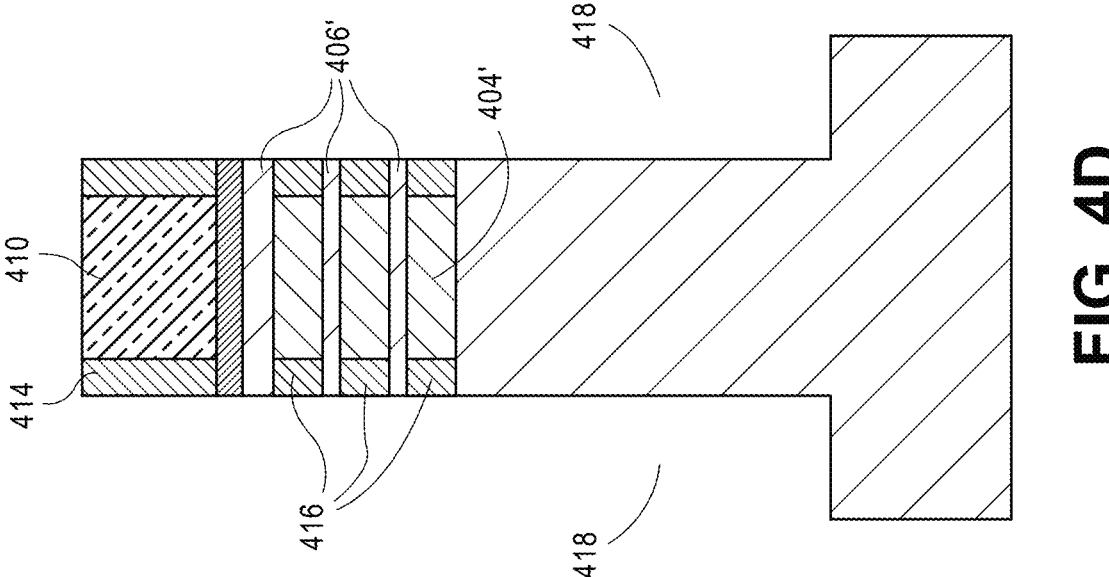

Referring to FIG. 4B, a dummy gate stack 410 is formed over the vertical arrangement of nanowires 406. Portions of the vertical arrangement of nanowires 406 are then released by removing portions of the silicon germanium layer 404 to provide recessed silicon germanium layers 404' and cavities 412, as is depicted in FIG. 4C.

It is to be appreciated that the structure of FIG. 4C may be fabricated to completion without first performing the deep etch and asymmetric contact processing described below in association with FIG. 4D. In either case (e.g., with or without asymmetric contact processing), in an embodiment, a fabrication process involves use of a process scheme that provides a gate-all-around integrated circuit structure having a depopulated channel structure.

Figure 4D:
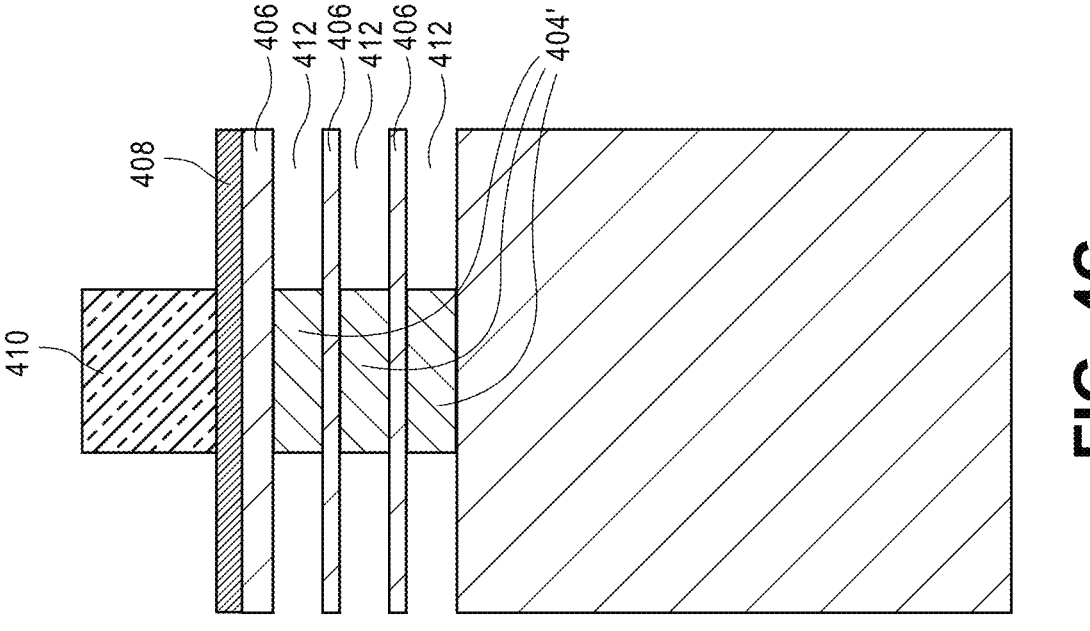
Figures 4E, 4F, 4G:
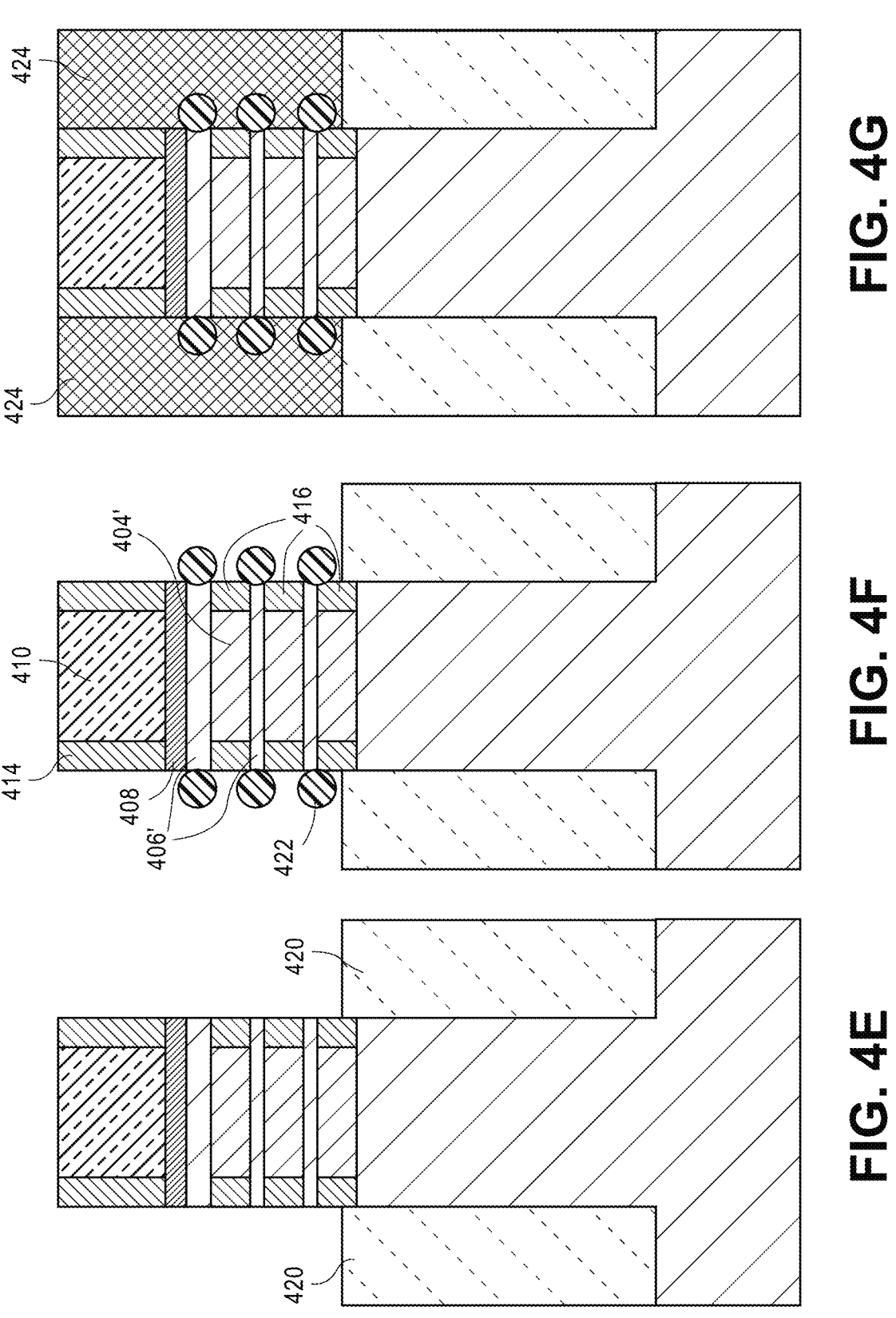

Referring to FIG. 4D, upper gate spacers 414 are formed at sidewalls of the gate structure 410. Cavity spacers 416 are formed in the cavities 412 beneath the upper gate spacers 414. A deep trench contact etch is then performed to form trenches 418 and to formed recessed nanowires 406'. FIG. 4E shows a sacrificial material 420 is then formed in the trenches 418, as is depicted. The sacrificial material 420 is not required and instead a doped sub-fin may be used to prevent substrate leakage.

Referring to FIG. 4F, a first epitaxial source or drain structure (e.g., left-hand features 422) is formed at a first end of the vertical arrangement of nanowires 406'. A second epitaxial source or drain structure (e.g., right-hand features 422) is formed at a second end of the vertical arrangement of nanowires 406'. Although the epitaxial source or drain structures 422 are shown as discrete structures, in another embodiment the epitaxial source or drain structures 422 are non-discrete epitaxial source or drain structures.

As described above and according the disclosed embodiments, the epitaxial source or drain structures 422 are formed by first depositing first pEPI region 358 of germanium and boron (Ge:B) (shown in FIG. 3A) over the vertical arrangement of nanowires 406'. This is followed by formation a second pEPI region 359 of silicon, germanium and boron on the first pEPI region 358 at a contact location, and a titanium silicide conductive contact material 364A is then formed over the second pEPI region 359 at contact locations.

FIG. 4G shows that after formation of the epitaxial source or drain structures 422, an inter-layer dielectric (ILD) material 424 is then formed at the sides of the gate electrode 410 and adjacent to the source or drain structures 422, as is depicted.

Figures 4H, 4I, 4J:
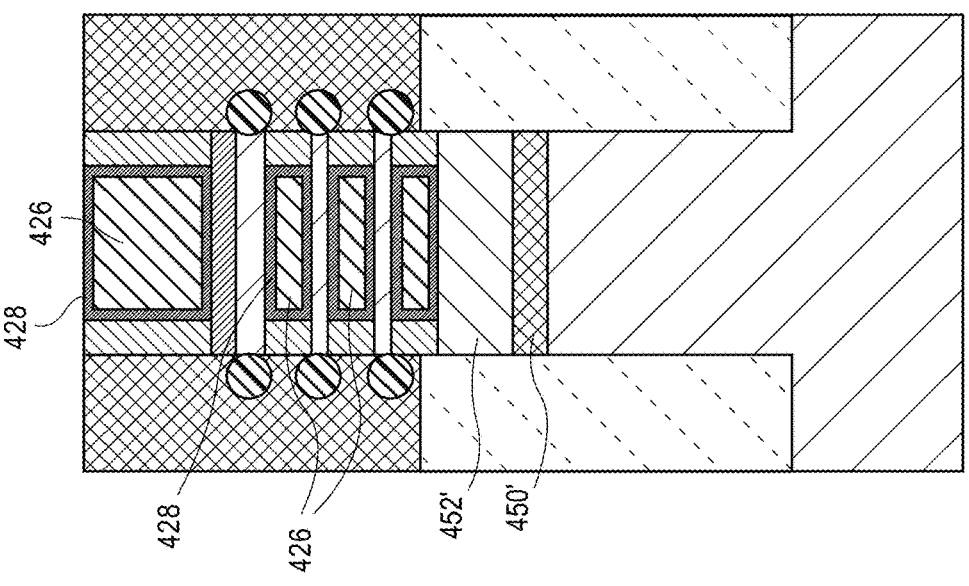

Referring to FIG. 4H, a replacement gate process is used to form a permanent gate dielectric 428 and a permanent gate electrode 426. In an embodiment, subsequent to removal of gate structure 410 and form a permanent gate dielectric 428 and a permanent gate electrode 426, the recessed silicon germanium layers 404' are removed to leave upper active nanowires or nanoribbons 406'. In an embodiment, the recessed silicon germanium layers 404' are removed selectively with a wet etch that selectively removes the silicon germanium while not etching the silicon layers. Etch chemistries such as carboxylic acid/nitric acid/HF chemistry, and citric acid/nitric acid/HF, for example, may be utilized to selectively etch the silicon germanium. Halide-based dry etches or plasma-enhanced vapor etches may also be used to achieve the embodiments herein.

Referring again to FIG. 4H, one or more of the bottom-most nanowires or nanoribbons 406' may ultimately be targeted for removal. The permanent gate dielectric 428 and a permanent gate electrode 426 are formed to surround the nanowires or nanoribbons 406' and the targeted nanowire or nanoribbons.

Referring to FIG. 4I, the ILD material 424 is then removed. The sacrificial material 420 is then removed from one of the source drain locations (e.g., right-hand side) to form trench 432, but is not removed from the other of the source drain locations to form trench 430.

Referring to FIG. 4J, a first conductive contact structure 434 is formed coupled to the first epitaxial source or drain structure (e.g., left-hand features 422). A second conductive contact structure 436 is formed coupled to the second epitaxial source or drain structure (e.g., right-hand features 422). The second conductive contact structure 436 is formed deeper along the fin 402 than the first conductive contact structure 434. The first and second conductive contact structures 434 and 436 comprise Ti silicide.

In an embodiment, although not depicted in FIG. 4J, the method further includes forming an exposed surface of the second conductive contact structure 436 at a bottom of the fin 402. Conductive contacts may include a contact resistance reducing layer and a primary contact electrode layer, where examples can include Ti, Ni, Co for the former, and W, Ru, Co for the latter.

In an embodiment, the second conductive contact structure 436 is deeper along the fin 402 than the first conductive contact structure 434, as is depicted. In one such embodiment, the first conductive contact structure 434 is not along the fin 402, as is depicted. In another such embodiment, not depicted, the first conductive contact structure 434 is partially along the fin 402.

In an embodiment, the second conductive contact structure 436 is along an entirety of the fin 402. In an embodiment, although not depicted, in the case that the bottom of the fin 402 is exposed by a back-side substrate removal process, the second conductive contact structure 436 has an exposed surface at a bottom of the fin 402.

In an embodiment, structures fabricated using the processing scheme or portions of the processing scheme described in association with FIGS. 4A-4J can be fabricated to include a first pEPI region protected by ultra-low PMOS contact resistivity structures comprising i) a second pEPI region of silicon, germanium and boron on the first pEPI region at a contact location, and ii) titanium silicide conductive contact material 364A on the second pEPI region, such as described above in association with FIGS. 2, 3A and 3B.

In an embodiment, fins (and, possibly nanowires) are composed of a crystalline silicon germanium layer which may be doped with a charge carrier, such as but not limited to phosphorus, arsenic, boron, gallium or a combination thereof.

In an embodiment, trench isolation region, and trench isolation regions (trench isolations structures or trench isolation layers) described throughout, may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, trench isolation region is composed of a dielectric material such as, but not limited to, silicon dioxide, silicon oxy-nitride, silicon nitride, or carbon-doped silicon nitride.

The gate 426 may be composed of a gate electrode stack which includes a gate dielectric layer and a gate electrode layer. In an embodiment, the gate electrode of the gate electrode stack is composed of a metal gate and the gate dielectric layer 428 is composed of a high-k material. For example, in one embodiment, the gate dielectric layer 428 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 428 may include a layer of native oxide formed from the top few layers of the substrate fin 402. In an embodiment, the gate dielectric layer 428 is composed of a top high-k portion and a lower portion composed of an oxide of a semiconductor material. In one embodiment, the gate dielectric layer 428 is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode layer is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode layer is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode layer may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact and overlying gate contact via may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In another aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, back-side processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

It is to be appreciated that the structures resulting from the above exemplary processing schemes may be used in a same or similar form for subsequent processing operations to complete device fabrication, such as PMOS and/or NMOS device fabrication. As an example of a completed device, FIG. 5 illustrate a cross-sectional view of a non-planar integrated circuit structure as taken along a gate line, in accordance with an embodiment of the present disclosure.

Figure 5:
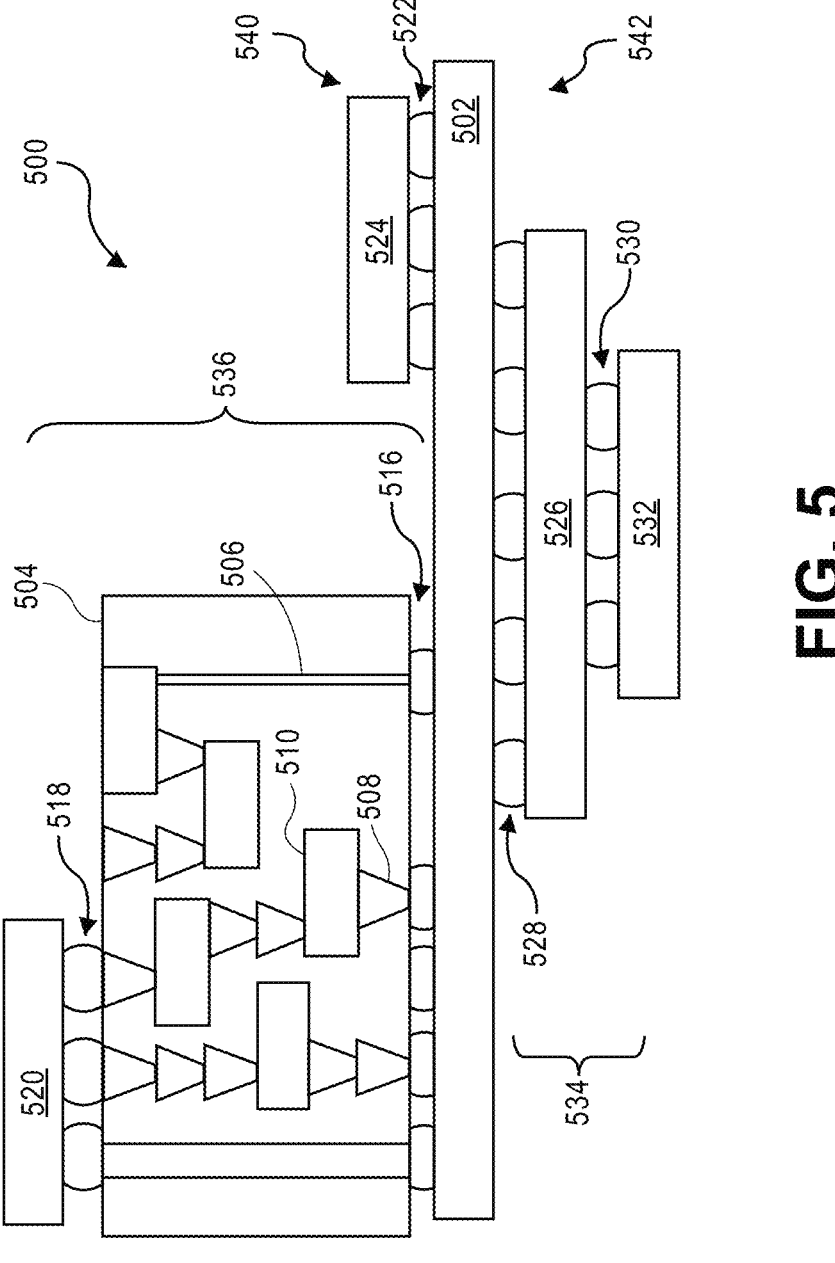
FIG. 5 is a cross-sectional side view of an integrated circuit (IC) device assembly that may include one or more transistors with a low temperature, high germanium, high boron SiGe:B pEPI with titanium silicide contacts for ultra-low PMOS contact resistivity and thermal stability, in accordance with one or more of the embodiments disclosed herein.

FIG. 5 is a cross-sectional side view of an integrated circuit (IC) device assembly that may include one or more transistors with a first pEPI region protected by ultra-low PMOS contact resistivity structures comprising i) a second pEPI region of silicon, germanium and boron on the first pEPI region at a contact location, and ii) a capping layer comprising silicon over the second pEPI region for thermal stability and low PMOS contact resistivity, in accordance with one or more of the embodiments disclosed herein.

Referring to FIG. 5, an IC device assembly 500 includes components having one or more integrated circuit structures described herein. The IC device assembly 500 includes a number of components disposed on a circuit board 502 (which may be, e.g., a motherboard). The IC device assembly 500 includes components disposed on a first face 540 of the circuit board 502 and an opposing second face 542 of the circuit board 502. Generally, components may be disposed on one or both faces 540 and 542. In particular, any suitable ones of the components of the IC device assembly 500 may include a number of transistor architectures utilizing IC structures with a first pEPI region protected by ultra-low PMOS contact resistivity structures comprising i) a second pEPI region of silicon, germanium and boron on the first pEPI region at a contact location, and ii) a capping layer comprising silicon over the second pEPI region for thermal stability and low PMOS contact resistivity, such as disclosed herein.

In some embodiments, the circuit board 502 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 502. In other embodiments, the circuit board 502 may be a non-PCB substrate.

The IC device assembly 500 illustrated in FIG. 5 includes a package-on-interposer structure 536 coupled to the first face 540 of the circuit board 502 by coupling components 516. The coupling components 516 may electrically and mechanically couple the package-on-interposer structure 536 to the circuit board 502, and may include solder balls, male and female portions of a socket, an adhesive, an underfill material, and/or any other suitable electrical and/or mechanical coupling structure.

The package-on-interposer structure 536 may include an IC package 520 coupled to an interposer 504 by coupling components 518. The coupling components 518 may take any suitable form for the application, such as the forms discussed above with reference to the coupling components 516. Although a single IC package 520 is shown, multiple IC packages may be coupled to the interposer 504. It is to be appreciated that additional interposers may be coupled to the interposer 504. The interposer 504 may provide an intervening substrate used to bridge the circuit board 502 and the IC package 520. The IC package 520 may be or include, for example, a die, or any other suitable component. Generally, the interposer 504 may spread a connection to a wider pitch or reroute a connection to a different connection. For example, the interposer 504 may couple the IC package 520 (e.g., a die) to a ball grid array (BGA) of the coupling components 516 for coupling to the circuit board 502. In the embodiment illustrated in FIG. 5, the IC package 520 and the circuit board 502 are attached to opposing sides of the interposer 504. In other embodiments, the IC package 520 and the circuit board 502 may be attached to a same side of the interposer 504. In some embodiments, three or more components may be interconnected by way of the interposer 504.

The interposer 504 may be formed of an epoxy resin, a fiberglass-reinforced epoxy resin, a ceramic material, or a polymer material such as polyimide. In some implementations, the interposer 504 may be formed of alternate rigid or flexible materials that may include the same materials described above for use in a semiconductor substrate, such as silicon, germanium, and other group III-V and group IV materials. The interposer 504 may include metal interconnects 510 and vias 508, including but not limited to through-silicon vias (TSVs) 506. The interposer 504 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 504. The package-on-interposer structure 536 may take the form of any of the package-on-interposer structures known in the art.

The IC device assembly 500 may include an IC package 524 coupled to the first face 540 of the circuit board 502 by coupling components 522. The coupling components 522 may take the form of any of the embodiments discussed above with reference to the coupling components 516, and the IC package 524 may take the form of any of the embodiments discussed above with reference to the IC package 520.

The IC device assembly 500 illustrated in FIG. 5 includes a package-on-package structure 534 coupled to the second face 542 of the circuit board 502 by coupling components 528. The package-on-package structure 534 may include an IC package 526 and an IC package 532 coupled together by coupling components 530 such that the IC package 526 is disposed between the circuit board 502 and the IC package 532. The coupling components 528 and 530 may take the form of any of the embodiments of the coupling components 516 discussed above, and the IC packages 526 and 532 may take the form of any of the embodiments of the IC package 520 discussed above. The package-on-package structure 534 may be configured in accordance with any of the package-on-package structures known in the art.

Figure 6:
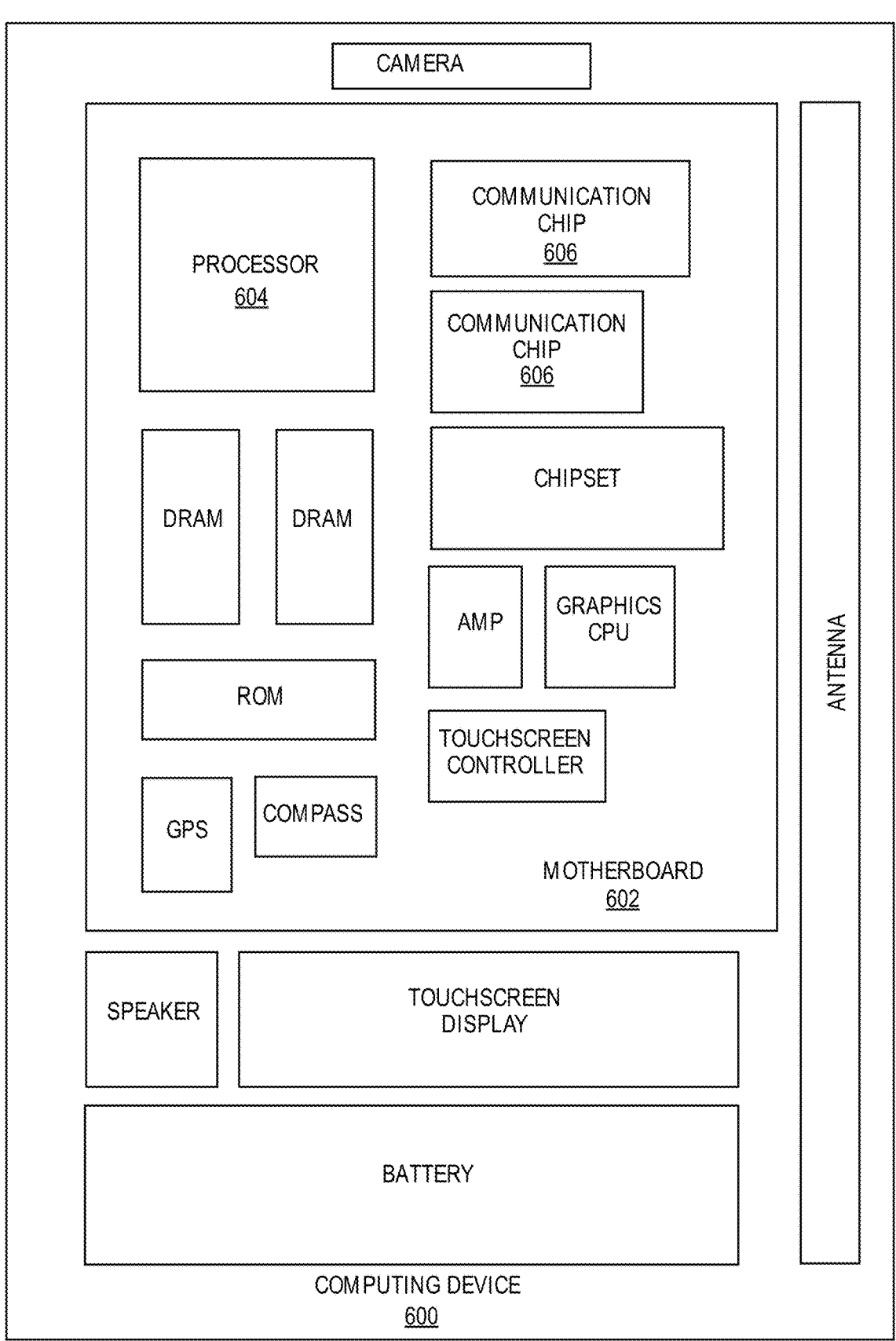
FIG. 6 illustrates a computing device in accordance with one implementation of the disclosure.

FIG. 6 illustrates a computing device 600 in accordance with one implementation of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the disclosure, the integrated circuit die of the processor includes one or more transistor architectures utilizing IC structures with a first pEPI region protected by ultra-low PMOS contact resistivity structures comprising i) a second pEPI region of silicon, germanium and boron on the first pEPI region at a contact location, and ii) a capping layer comprising silicon over the second pEPI region for thermal stability and low PMOS contact resistivity, in accordance with implementations of embodiments of the disclosure. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of embodiments of the disclosure, the integrated circuit die of the communication chip includes one or more transistor architectures utilizing IC structures with a first pEPI region protected by ultra-low PMOS contact resistivity structures comprising i) a second pEPI region of silicon, germanium and boron on the first pEPI region at a contact location, and ii) a titanium silicide conductive contact material on the second pEPI region for thermal stability and low PMOS contact resistivity, in accordance with implementations of embodiments of the disclosure.

In further implementations, another component housed within the computing device 600 may contain an integrated circuit die that includes one or more transistor architectures utilizing IC structures with a first pEPI region protected by ultra-low PMOS contact resistivity structures comprising i) a second pEPI region of silicon, germanium and boron on the first pEPI region at a contact location, and ii)) a titanium silicide conductive contact material on the second pEPI region for thermal stability and low PMOS contact resistivity, in accordance with implementations of embodiments of the disclosure.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, embodiments described herein include transistor architectures utilizing IC structures with a first pEPI region protected by ultra-low PMOS contact resistivity structures comprising i) a second pEPI region of silicon, germanium and boron on the first pEPI region at a contact location, and ii) a titanium silicide conductive contact material on the second pEPI region for thermal stability and low PMOS contact resistivity.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a plurality of nanowires above a sub-fin. A gate stack is over the plurality of nanowires and the sub-fin. Epitaxial source or drain structures are on opposite ends of the plurality of nanowires. The epitaxial source or drain structures comprise i) a first PMOS epitaxial (pEPI) region of germanium and boron, ii) a second pEPI region of silicon, germanium and boron on the first pEPI region at a contact location, iii) a titanium silicide conductive contact material on the second pEPI region.

Example embodiment 2: The integrated circuit structure of embodiment 1, wherein the second pEPI region comprises an atomic percentage of germanium of approximately 60-100% and a chemical concentration of boron of approximately 1 $e^{21}/cm^3$.

Example embodiment 3: The integrated circuit structure of embodiment 1 or 2, wherein the second pEPI region is approximately 6-10 nm in thickness.

Example embodiment 4: The integrated circuit structure of embodiment 1, 2 or 3, wherein the titanium of the conductive contact material diffuses into the second pEPI region less than approximately 2 nm.

Example embodiment 5: The integrated circuit structure of embodiment 1, 2, 3, o 4, wherein use of the second pEPI region and the titanium silicide conductive contact material results in a contact resistivity of ~1 e−9 Ohm cm2.

Example embodiment 6: The integrated circuit structure of embodiment 1, 2, 3, 4, or 5, wherein an atomic percentage of the germanium in the first PMOS pEPI region is approximately 50-55%.

Example embodiment 7: A computing device, comprising a board, and a component coupled to the board. The component includes an integrated circuit structure comprising a plurality of nanowires above a sub-fin. A gate stack is over the plurality of nanowires and the sub-fin. Epitaxial source or drain structures are on opposite ends of the plurality of nanowires. The epitaxial source or drain structures comprise i) a first PMOS epitaxial (pEPI) region of germanium and boron, ii) a second pEPI region of silicon, germanium and boron on the first pEPI region at a contact location, iii) a titanium silicide conductive contact material on the second pEPI region.

Example embodiment 8: The computing device of embodiment 7, further comprising: a memory coupled to the board.

Example embodiment 9: The computing device of embodiment 7 or 8, further comprising: a communication chip coupled to the board.

Example embodiment 10: The computing device of embodiment 7, 8 or 9, further comprising: a battery coupled to the board.

Example embodiment 11: The computing device of embodiment 7, 8, 9 or 10, wherein the component is a packaged integrated circuit die.

Example embodiment 12: An integrated circuit structure includes a plurality of nanowires above a sub-fin. A gate stack is over the plurality of nanowires and the sub-fin. Epitaxial source or drain structures are on opposite ends of the plurality of nanowires. The epitaxial source or drain structures comprise i) a first PMOS epitaxial (pEPI) region of germanium and boron, ii) a second pEPI region of silicon, germanium and boron on the first pEPI region at a contact location, iii) titanium silicide conductive contact material over the second pEPI region.

Example embodiment 13: The integrated circuit structure of embodiment 12, wherein the second pEPI region comprises an atomic percentage of germanium of approximately 60-100% and a chemical concentration of boron of approximately 1 $e^{21}/cm^3$.

Example embodiment 14: The integrated circuit structure of embodiment 12 or 13, wherein the second pEPI region is approximately 6-10 nm in thickness.

Example embodiment 15: A computing device comprises a board and a component coupled to the board. The component includes an integrated circuit structure comprising a PMOS region. The PMOS region comprises a plurality of nanowires above a sub-fin. A gate stack is over the plurality of nanowires and the sub-fin. An epitaxial source or drain structures is on opposite ends of the plurality of nanowires. The epitaxial source or drain structures comprise i) a first PMOS epitaxial (pEPI) region of germanium and boron, ii) a second pEPI region of silicon, germanium and boron on the first pEPI region at a contact location, iii) titanium silicide conductive contact material over the second pEPI region.

Example embodiment 16: The computing device of embodiment 15, further comprising: a memory coupled to the board.

What is claimed is:

1. An integrated circuit structure, comprising:
a plurality of nanowires above a sub-fin;
a gate stack over the plurality of nanowires and the sub-fin; and
epitaxial source or drain structures on opposite ends of the plurality of nanowires, the epitaxial source or drain structures comprising:
a first PMOS epitaxial (pEPI) region of germanium and boron,
a second pEPI region of silicon, germanium and boron on the first pEPI region at a contact location, the second pEPI region comprising an atomic percentage of germanium of approximately 60-100% and being approximately 6-10 nm in thickness, and
a titanium silicide conductive contact material on the second pEPI region.

2. The integrated circuit structure of claim 1, wherein the second pEPI region comprises a chemical concentration of boron of approximately $1e^{21}/cm^3$.

3. The integrated circuit structure of claim 1, wherein the titanium silicide conductive contact material diffuses into the second pEPI region less than approximately 2 nm.

4. The integrated circuit structure of claim 1, wherein use of the second pEPI region and the titanium silicide conductive contact material results in a contact resistivity of approximately $1e^{-9}$ Ohm $cm^2$.

5. The integrated circuit structure of claim 1, wherein an atomic percentage of the germanium in the first PMOS pEPI region is approximately 50-55%.

6. A computing device, comprising:
a board; and
a component coupled to the board, the component including an integrated circuit structure, comprising:
a plurality of nanowires above a sub-fin;
a gate stack over the plurality of nanowires and the sub-fin; and
epitaxial source or drain structures on opposite ends of the plurality of nanowires, the epitaxial source or drain structures comprising:
a first PMOS epitaxial (pEPI) region of germanium and boron, a second pEPI region of silicon, germanium and boron on the first pEPI region at a contact location, the second pEPI region comprising an atomic percentage of germanium of approximately 60-100% and being approximately 6-10 nm in thickness, and a titanium silicide conductive contact material on the second pEPI region.

7. The computing device of claim 6, further comprising: a memory coupled to the board.

8. The computing device of claim 6, further comprising: a communication chip coupled to the board.

9. The computing device of claim 6, further comprising: a battery coupled to the board.

10. The computing device of claim 6, wherein the component is a packaged integrated circuit die.

11. An integrated circuit structure, comprising:
a plurality of nanowires above a sub-fin in a PMOS region;
a gate stack over the plurality of nanowires and the sub-fin; and
epitaxial source or drain structures on opposite ends of the plurality of nanowires, the epitaxial source or drain structures comprising:
a first PMOS epitaxial (pEPI) region of germanium and boron,
a second pEPI region of silicon, germanium and boron on the first pEPI region at a contact location, the second pEPI region comprising an atomic percentage of germanium of approximately 60-100% and being approximately 6-10 nm in thickness, and a titanium silicide conductive contact material over the second pEPI region.

12. The integrated circuit structure of claim 11, wherein the second pEPI region comprises a chemical concentration of boron of approximately $1e^{21}/cm^3$.

13. A computing device, comprising:
a board; and
a component coupled to the board, the component including an integrated circuit structure, comprising:
a PMOS region comprising;
a plurality of nanowires above a sub-fin;
a gate stack over the plurality of nanowires and the sub-fin; and
epitaxial source or drain structures on opposite ends of the plurality of nanowires, the epitaxial source or drain structures comprising:
a first PMOS epitaxial (pEPI) region of germanium and boron,
a second pEPI region of silicon, germanium and boron on the first pEPI region at a contact location, the second pEPI region comprising an atomic percentage of germanium of approximately 60-100% and being approximately 6-10 nm in thickness, and
a titanium silicide conductive contact material over the second pEPI region.

14. The computing device of claim 13, further comprising:
a memory coupled to the board.

* * * * *